United States Patent [19]

Yerkes

[11] 4,159,212

[45] Jun. 26, 1979

[54] LUMINESCENT SOLAR COLLECTOR

[75] Inventor: John W. Yerkes, Granada Hills, Calif.

[73] Assignee: Atlantic Richfield Company, Los Angeles, Calif.

[21] Appl. No.: 943,848

[22] Filed: Sep. 18, 1978

[51] Int. Cl.² ............................................. H01L 31/04
[52] U.S. Cl. ........................... 136/89 FC; 136/89 CA; 136/89 SJ; 136/89 CC
[58] Field of Search ......... 136/89 FC, 89 CL, 89 CA

[56] References Cited
U.S. PATENT DOCUMENTS

| | | | |
|---|---|---|---|
| 3,998,659 | 12/1976 | Wakefield | 136/89 |
| 4,110,123 | 8/1978 | Goetzberger | 136/89 HY |
| 4,127,425 | 11/1978 | Chambers | 136/89 PC |
| 4,130,445 | 12/1978 | Bueden | 136/89 PC |

Primary Examiner—Aaron Weisstuch
Attorney, Agent, or Firm—Roderick W. MacDonald

[57] ABSTRACT

A luminescent solar collector containing at least one luminescent member having a pair of opposed surfaces and at least one photovoltaic means embedded in the luminescent member and extending essentially from one of said surfaces to the opposing surface of the luminescent member so that a portion of the photovoltaic means of a first conductivity is adjacent one of said surfaces while a portion of the same photovoltaic means that is of a second conductivity is adjacent the opposing surface.

9 Claims, 8 Drawing Figures

LUMINESCENT SOLAR COLLECTOR

BACKGROUND OF THE INVENTION

It is known that a photovoltaic semiconductor p-n junction can convert to electricity only that portion of the incident photon energy spectrum, typically solar radiation, which creates hole-electron pairs within a given semiconductor material. For example, in a silicon photovoltaic cell only that portion of the solar spectrum with energy slightly greater than or equal to the 1.1 electron volt band gap is converted into electricity. Photons of lesser energy are not absorbed at all. More energetic photons are absorbed and most of the energy is lost in heating the cell. It is this heating and absorption process which can degrade the cell's energy conversion efficiency. To maximize the efficiency of a given photovoltaic cell, it is advantageous to convert as much of the available light as possible into an energy range to which such cell can optimally respond in the generation of electricity before the light strikes the cell's surface.

One technique for achieving such conversion takes advantage of the fact that light falling upon a luminescent agent is characteristically reradiated or emitted in a band of wavelengths of known energy content. Also, light absorbed by such an agent in one direction is reradiated isotropically. Such agents include, for example, pigments, metal oxides and organic dyes which are used in scintillation counters, lasers, and the like. For the purpose of this invention the term "luminescent agent" includes all types of luminescent agents exhibiting all species of luminescence, including, but not limited to, fluorescence and phosphorescence.

It has been shown that the dispersal of a luminescent agent within a sheet of glass or plastic, one of whose major surfaces is exposed to light, concentrates and focuses a flux of light of known energy toward one or more of the thin edge faces of the sheet. If a photovoltaic cell responsive to light at that energy level is optically coupled to such edge face, the energy conversion efficiency of the cell increases. In this invention a light transmissive member of such construction and properties is termed a "luminescent member" and a photovoltaic solar collector employing such a member is termed a "luminescent solar collector". A luminescent solar collector of this type is fully and completely disclosed in *Optics*, Vol. 15, No. 10, pages 2299–2300, dated October, 1976, the disclosure of which is incorporated herein by reference.

When employing photovoltaic cells on the thin edge face of a sheet of luminescent material, some of the light that reaches the interior of the luminescent material has to travel a long distance before it reaches the edge face photovoltaic cell and therefore runs the substantial risk of being absorbed before it ever reaches the cell. Accordingly, it is highly desirable to minimize the distance which light has to travel inside a luminescent member before it reaches a photovoltaic cell.

SUMMARY OF THE INVENTION

According to this invention, there is provided a luminescent solar collector which comprises at least one luminescent member having a pair of opposed surfaces and at least one photovoltaic means embedded in the luminescent member and extending essentially from one of said surfaces of said luminescent member to the opposing surface of said luminescent member, a portion of said photovoltaic means of a first conductivity being adjacent one of such surfaces while a portion of the same photovoltaic means that is of a second conductivity is adjacent the opposing surface.

By this invention, photovoltaic cells are embedded in a luminescent member itself and can be spread out throughout the interior of the member so that light within the luminescent member need not travel to an edge face before it reaches the photovoltaic cell, but rather moves only a very short distance within the member before it encounters such a cell.

Accordingly, it is an object of this invention to provide a new and improved luminescent solar collector.

Other aspects, objects and advantages of this invention will be apparent to those skilled in the art from this disclosure and the appended claims.

DETAILED DESCRIPTION OF THE INVENTION

Figure 1:
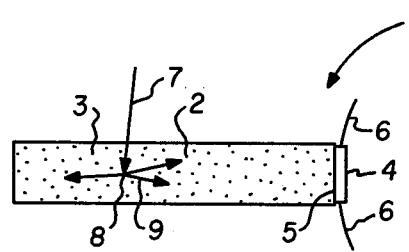
FIG. 1 shows a prior art luminescent solar collector.

More specifically, FIG. 1 shows luminescent solar collector 1 which is composed of a luminescent member 2 containing one or more luminescent agents dispersed throughout as represented by dots 3 and having a photovoltaic cell 4 mounted on thin edge face 5 of member 2, wires 6 being provided for removal of electricity from cell 4. It can be seen from this FIGURE that a ray of light 7 entering the interior of member 2 and striking luminescent agent particle 8 is reradiated at longer wavelength light energy, as represented by a plurality of subrays 9. It can be seen that subrays 9 have a large mass of member 2 to travel through before they ever reach cell 4 and therefore a substantial amount of this reradiated light will simply be absorbed by member 2 before it ever reaches cell 4, thereby decreasing the efficiency of collector 1 in relation to the amount of light in the interior of member 2 that is available for the generation of electricity.

Figure 2:
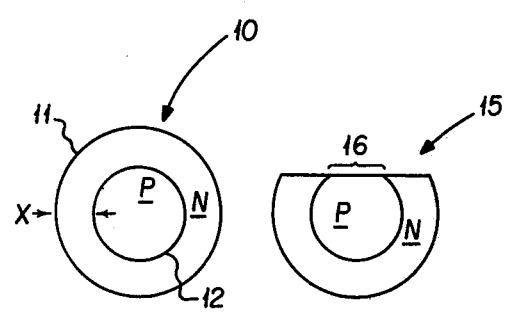
FIG. 2 shows a photovoltaic means useful in this invention.

As background for this invention, FIG. 2 shows the preparation of a suitable photovoltaic cell for this invention. FIG. 2 shows a spherical semiconductor body 1 formed from silicon or other known semiconductor material and doped with an impurity of a first conductivity such as boron which gives the entire sphere a p conductivity. When the sphere is subjected to a diffusion or other known process in which a second impurity is introduced, the second impurity of opposite conductivity such as phosphorus is introduced onto the sphere. The phosphorus diffuses a finite distance X from out of surface 11 towards the interior of sphere 10 to produce a second conductivity area, which would be an n area in the case of phosphorus, thereby establishing a p-n junction 12 in the interior of sphere 10.

Thus, there is produced a sphere whose total outer surface is of a first conductivity—n—with an underlying volume of material of a second conductivity—p. To make sphere 10 an operable photovoltaic cell, electrical access must be made to the underlying p conductivity material and truncated sphere 15 of FIG. 2 shows a sphere 10 wherein a portion of the n conductivity material has been removed to expose in area 16 a portion of the underlying p conductivity material so that an electrical contact can be attached in area 16 and another contact can be attached to the n conductivity layer, thereby obtaining an operable photovoltaic cell.

Figure 3:
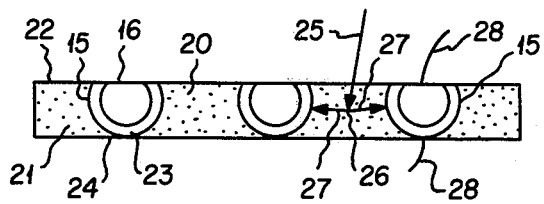
FIG. 3 shows an embodiment of a luminescent solar collector within this invention.

In this invention, as shown by FIG. 3, a plurality of cells such as cell 15 of FIG. 2 or other suitably configured cells as will be described hereinafter or be made obvious to one skilled in the art in view of this disclosure are embedded in a luminescent member 20 which contains one or more luminescent agents dispersed throughout, as represented by dots 21.

As shown in FIG. 3, a plurality of photovoltaic cells 15 of FIG. 2 are embedded in luminescent member 20 so that p conductivity portion 16 is at or adjacent surface 22 of member 20 while an n conductivity portion 23 is adjacent the opposing surface 24 of member 20. This way a ray of light 25 reaching the interior of member 20 and impinging upon a luminescent agent particle 26 will be absorbed and reradiated as a plurality of subrays 27 which do not have to travel very far through member 20 before they encounter one or more photovoltaic cells 15, thereby obviating the prior art disadvantage of traveling through a substantial mass of luminescent member before ever reaching a photovoltaic cell. By attaching suitable electrical contacts and wires 28 to the n and p portions of the cell adjacent the opposing surfaces 22 and 24 of luminescent member 20, electrically can be recovered in a conventional manner as is well known in the art.

Figure 4:
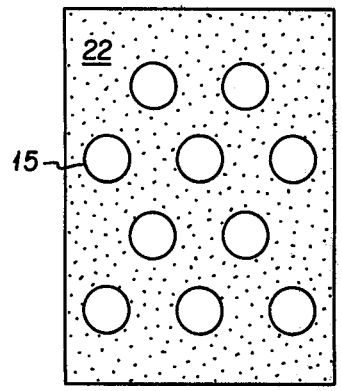
FIG. 4 shows the top view of the luminescent solar collector of FIG. 3.

FIG. 4 shows a top view of the cross section of the luminescent solar collector of FIG. 3 and shows the photovoltaic cells 15 are distributed throughout the body of luminescent member 20 so that no reradiated subrays from luminescent agents have far to go before encountering a photovoltaic cell.

As would be obvious to one skilled in the art, more than one luminescent member can be employed and the photovoltaic cells can be distributed randomly or by design within the body of the luminescent member.

Also, a large variety of configurations of suitable photovoltaic cells can be used for embedding in the interior of a luminescent member in accordance with this invention.

Figure 5:
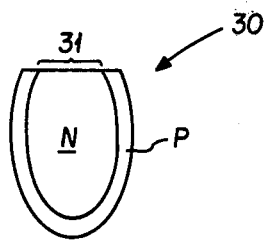
FIG. 5 through 8 show various modifications of photovoltaic cells useful in this invention.

For example, FIG. 5 shows another species of curvilinear photovoltaic cells, which in this case is a truncated oblate spheroid 30 which can have an outer surface layer with p conductivity, one end having been removed to expose a portion 31 of n conductivity material for disposition at or near a surface of the luminescent member in which it is to be embedded. It should be understood that the different conductivity portions of a photovoltaic cell to which electrical contacts are to be made need not be precisely at the surface of the luminescent member although this is perfectly acceptable in this invention, it being sufficient if the surfaces are sufficiently near or adjacent to the surface that electrical contact can be made through mechanical or other desired means. Of course, if the photovoltaic cells such as cell 10 of FIG. 2 are embedded in the luminescent member material prior to exposure of the underlying p region, and then a portion of the luminescent member itself together with the embedded cells is removed to expose the underlying p region as represented for cell 15 of FIG. 2, the exposed p portion 16 will be precisely at the surface of the luminescent member, but this is not required by this invention.

Figure 6:
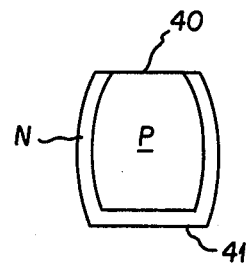

FIG. 6 shows yet another curvilinear photovoltaic cell which is comprised of upper and lower flat surfaces 40 and 41 with an internal mass of p conductivity and an external layer of n conductivity. Surface 41 thereby provides an exposed portion of n conductivity material while surface 40 provides a portion of exposed p conductivity material.

The photovoltaic cells of this invention need not be curvilinear, but rather can be polygons or other suitable configurations obvious to one skilled in the art once the essence of this invention has been disclosed to them.

Figure 7:
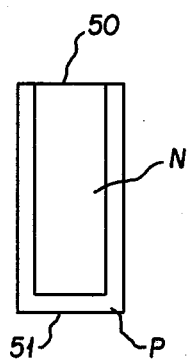

For example, FIG. 7 shows a rectangular photovoltaic cell with internal n conductivity and surface p conductivity, upper surface 50 providing exposed n conductivity material while lower surface 51 provides exposed conductivity material.

Figure 8:
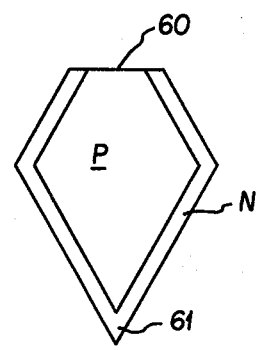

Similarly, FIG. 8 shows a truncated parallelogram which has internal p conductivity and surface n conductivity, a flat surface 60 providing exposed p conductivity material while apex 61 would provide exposed n type material which can be at, on or protruding from its adjacent surface of the luminescent member in which it is embedded.

The light transmitting member matrix material and the luminescent member matrix material can be the same or different but are preferably a polymeric or glass material which is transparent at least to the visible and near infrared light spectrum. Such matrix material can therefore be of conventional plastic polymeric material such as polymethylmethacrylate, other known acrylic polymers, styrene polymers, and the like. The material can be glass or other transparent material into which luminescent agents can be incorporated and which, like the polymeric material, are nondeleterious to the luminescent agents, the photovoltaic cells, and the like. The matrix material can be any light transmitting material heretofore used in the manufacture of conventional nonluminescent photovoltaic devices. The matrix materials preferable do not contain impurities such as iron and the like which would absorb light rather than allow it to pass on to the photovoltaic cell.

The luminescent agents can include metals or oxides or other compounds of metals such as neodymium oxide employed in a glass matrix or one or more laser dyes such as the coumarin family of dyes and the rhodamine family of dyes. These dyes are quite complex chemically. All of these materials and the characteristics thereof are well known in the art and are commercially available so that further detailed description is unnecessary to inform one skilled in the art.

The luminescent agent or agents are simply dispersed in the matrix material by mixing or other dispersion while the matrix material is in a fluid state due to heating and the like.

Photovoltaic cells are well known in the art and vary widely as to their characteristics and can include, without limitation, silicon, cadmium sulfide, germanium, gallium arsenide, and many other known semiconductor materials.

Reasonable variations and modifications are possible within the scope of this disclosure without departing from the spirit and scope of this invention.

The embodiments of the invention in which an exclusive property or privilege is claimed are defined as follows:

1. A luminescent solar collector comprising at least one luminescent member having a pair of opposed surfaces, and at least one photovoltaic means embedded in said member and extending essentially from one of said opposed surfaces of said member to the other opposed surface of said member so that a portion of said photovoltaic means of a first conductivity is adjacent said one opposed surface and a portion of the same photovoltaic means that is of a second conductivity is adjacent said other opposed surface.

2. A collector according to claim 1 wherein said photovoltaic means is curvilinear in configuration.

3. A collector according to claim 2 wherein said photovoltaic means is essentially spherical.

4. A collector according to claim 2 wherein said photovoltaic means is truncated at at least one of said opposed surfaces.

5. A collector according to claim 1 wherein said photovoltaic means is composed of boron doped silicon having a phosphorus diffused surface layer, a portion of the phosphorus diffused surface layer being exposed at one surface of said luminescent member, a portion of the phosphorus diffused surface layer having been removed from an opposite portion of said photovoltaic means to expose an underlying boron doped portion, said exposed boron doped portion being adjacent the opposing surface of said luminescent member.

6. A collector according to claim 5 wherein said photovoltaic means is essentially spherical.

7. A collector according to claim 1 wherein said photovoltaic means is composed of a semiconductor material containing an impurity of a first conductivity and has a surface layer containing an impurity of a second conductivity, a portion of the second conductivity surface layer being exposed at one opposed surface of said luminescent member, a portion of the second conductivity surface layer having been removed from an opposite portion of said photovoltaic means to expose an underlying first conductivity portion, said exposed first conductivity portion being adjacent the other opposed surface of said luminescent member.

8. A collector according to claim 7 wherein said photovoltaic means is essentially spherical.

9. A collector according to claim 1 wherein said photovoltaic means is polygonal in configuration.

* * * * *